United States Patent
Kubo et al.

(10) Patent No.: US 10,113,239 B2
(45) Date of Patent: Oct. 30, 2018

(54) CUTTING TOOL

(71) Applicant: KYOCERA Corporation, Kyoto-shi, Kyoto (JP)

(72) Inventors: Hayato Kubo, Satsumasendai (JP); Kou Ri, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 186 days.

(21) Appl. No.: 15/039,927

(22) PCT Filed: Nov. 26, 2014

(86) PCT No.: PCT/JP2014/081228
§ 371 (c)(1),
(2) Date: May 27, 2016

(87) PCT Pub. No.: WO2015/080149
PCT Pub. Date: Jun. 4, 2015

(65) Prior Publication Data
US 2017/0009352 A1    Jan. 12, 2017

(30) Foreign Application Priority Data
Nov. 29, 2013 (JP) ................. 2013-247849

(51) Int. Cl.
*C23C 28/04* (2006.01)
*C23C 16/34* (2006.01)
(Continued)

(52) U.S. Cl.
CPC .......... *C23C 28/044* (2013.01); *C23C 16/308* (2013.01); *C23C 16/34* (2013.01);
(Continued)

(58) Field of Classification Search
USPC .......... 51/307, 309; 428/457, 469, 472, 697, 428/698, 699, 701, 702
See application file for complete search history.

(56) References Cited

U.S. PATENT DOCUMENTS 5,652,045 A * 7/1997 Nakamura ............. C23C 16/36
                                                      51/309
6,251,508 B1 * 6/2001 Ruppi ..................... C23C 16/36
                                                      428/697
(Continued)

FOREIGN PATENT DOCUMENTS

JP    08-118108 A       5/1996
JP    09-262705     * 10/1997
(Continued)

OTHER PUBLICATIONS

International Search Report, PCT/JP2014/081228, dated Feb. 24, 2015, 1 pg.

*Primary Examiner* — Archene A Turner
(74) *Attorney, Agent, or Firm* — Volpe and Koenig, P.C.

(57) ABSTRACT

A cutting tool includes: a base including cemented carbide containing Cr; and a coating layer including a Ti-based layer including at least a layer of $Ti(C_{x1}N_{y1}O_{z1})$ ($0 \le x1 \le 1$, $0 \le y1 \le 1$, $0 \le z1 \le 1$, $x1+y1+z1=1$), an $Al_2O_3$ layer, and an outermost layer of $Ti(C_{x3}N_{y3}O_{z3})$ ($0 \le x3 \le 1$, $0 \le y3 \le 1$, $0 \le z3 \le 1$, $x3+y3+z3=1$), and a content of Cr contained at a first Ti-based layer of the Ti-based layer is lower than a content of Cr contained in the base, and higher than a content of Cr contained at the $Al_2O_3$ layer, and a content of Cr contained at the outermost layer is higher than the content of Cr contained at the $Al_2O_3$ layer in a glow-discharge emission spectrometry.

10 Claims, 2 Drawing Sheets

(51) Int. Cl.
*C23C 16/36* (2006.01)
*C23C 16/40* (2006.01)
*C23C 16/30* (2006.01)

(52) U.S. Cl.
CPC ............ *C23C 16/36* (2013.01); *C23C 16/403* (2013.01); *C23C 28/042* (2013.01)

(56) References Cited

U.S. PATENT DOCUMENTS

| | | | |
|---|---|---|---|
| 6,554,548 B1 * | 4/2003 | Grab | C22C 29/08 51/307 |
| 6,575,671 B1 * | 6/2003 | North | C22C 29/08 407/119 |
| 6,589,602 B2 * | 7/2003 | Kobayashi | C22C 29/08 427/419.7 |
| 2004/0161639 A1 * | 8/2004 | Fukano | C23C 30/005 428/698 |

FOREIGN PATENT DOCUMENTS

| | | | |
|---|---|---|---|
| JP | 2000-126905 A | | 5/2000 |
| JP | 2005-105397 A | | 4/2005 |
| JP | 2011-036988 | * | 2/2011 |
| JP | 2011-036988 A | | 2/2011 |
| JP | 2011-122222 A | | 6/2011 |

* cited by examiner

CUTTING TOOL

TECHNICAL FIELD

The present invention relates to a cutting tool, and more particularly, to a cutting tool including a coating layer.

BACKGROUND ART

Conventionally, bases such as cemented carbide with coating layers of multiple layers such as a TiCN layer and an $Al_2O_3$ layer formed by deposition on the surfaces of the bases are widely used for cutting tools widely used for metal cutting work. In addition, it is known that the corrosion resistance of cemented carbide is enhanced by a Cr constituent contained in the cemented carbide, besides WC.

On the other hand, Patent Document 1 discloses a cutting tool coated with a TiN layer, a TiCN layer, a TiC layer, a TiCNO layer, an $Al_2O_3$ layer, and a TiN layer in order on the surface of a base by a CVD (chemical vapor deposition) method, where W and Co are diffused and contained at crystal grain boundaries of the TiN layer on the side closer to the base, the TiCN layer, and the TiC layer.

In addition, Patent Document 2 discloses a method of diffusing a Co constituent as well as a Cr constituent in a base of cemented carbide into a Ti-based coating layer on the side closer to the base, thereby enhancing the oxidation resistance of the Ti-based coating layer.

RELATED ART DOCUMENT

Patent Documents

Patent Document 1: Japanese Unexamined Patent Publication No. 08-118108
Patent Document 2: Japanese Unexamined Patent Publication No. 2011-36988

SUMMARY OF THE INVENTION

Problems to be Solved by the Invention

However, the cutting tool with W and Co diffused and contained in the coating layer as described in Patent Document 1 is likely to cause the oxidation of the coating layer to proceed, and thus has the possibility of decreasing the wear resistance of the coating layer. In addition, even the cutting tool with Co and Cr diffused in the coating layer as described in Patent Document 2 has insufficient oxidation resistance at the surface of the coating layer.

An object of the present invention is to provide a cutting tool which can inhibit the oxidation of a coating layer even in processing in which a cutting edge reaches high temperatures, such as high-speed cutting, thereby providing excellent wear resistance.

Means for Solving the Problems

A cutting tool according to the present embodiment includes: a base including cemented carbide containing Cr; and a coating layer including a Ti-based layer including at least a layer of Ti $(C_{x1}N_{y1}O_{z1})$ ($0 \leq x1 \leq 1$, $0 \leq y1 \leq 1$, $0 \leq z1 \leq 1$, $x1+y1+z1=1$), an $Al_2O_3$ layer, and an outermost layer of Ti $(C_{x3}N_{y3}O_{z3})$ ($0 \leq x3 \leq 1$, $0 \leq y3 \leq 1$, $0 \leq z3 \leq 1$, $x3+y3+z3=1$), which are laminated in order from the base side on the surface of the base, and a content of Cr contained at a thickness-center position of a first Ti-based layer of the Ti-based layer on a side closer to the base is lower than a content of Cr contained in the base, and higher than a content of Cr contained at a thickness-center position of the $Al_2O_3$ layer, and a content of Cr contained at a thickness-center position of the outermost layer is higher than the content of Cr contained at the thickness-center position of the $Al_2O_3$ layer in a glow-discharge emission spectrometry (GDS analysis).

Effects of the Invention

The cutting tool according to the present embodiment contains Cr in the Ti-based layer, $Al_2O_3$ layer, and outermost layer that coat the surface of the base of the cemented carbide, and the oxidation resistance of the coating layer is enhanced by adjusting the contents of Cr contained in the respective layers with respect to the content of Cr contained in the base so as to follow a predetermined order, and thereby the wear resistance of the cutting tool can be improved.

EMBODIMENTS FOR CARRYING OUT THE INVENTION

Figures 1A, 1B:
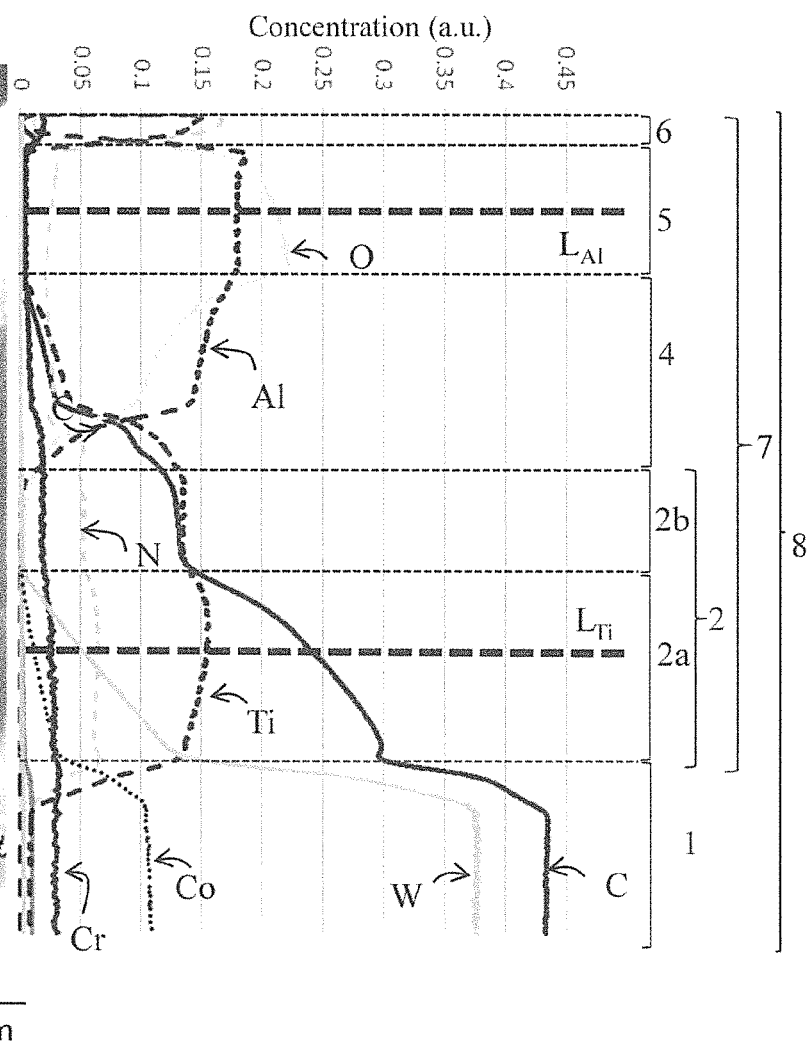
FIG. 1(a) and FIG. 1(b) are respectively a scanning electron microscope (SEM) photograph and a glow-discharge emission spectrometry (GDS analysis) data arranged for a cross section including a surface of a cutting tool according to the present embodiment.
Figure 2:
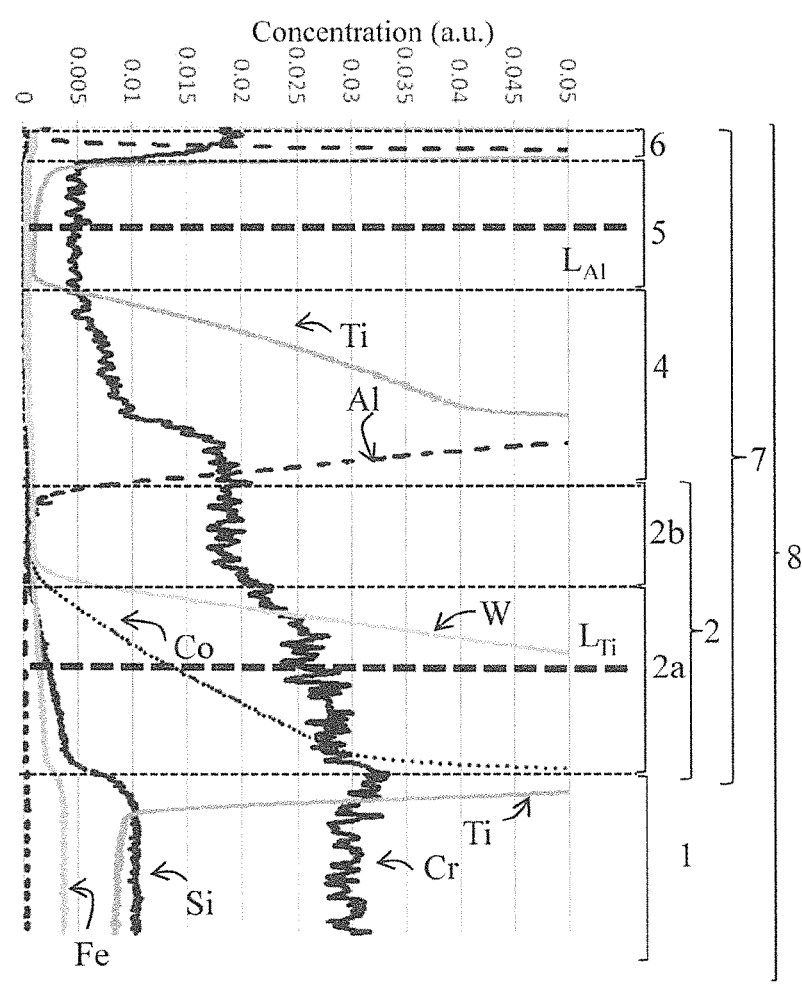
FIG. 2 is an enlarged view for checking distribution of minor constituents in the GDS analysis data in FIG. 1.

FIG. 1(a) is a scanning electron microscope (SEM) photograph for a cross section including a coating layer of a cutting tool, and FIG. 1(b) shows a glow-discharge emission spectrometry (GDS analysis) for the depth direction from the surface of the coating layer. Further, FIG. 2 is a partial enlarged view for checking distribution of minor constituents in the GDS analysis data. FIGS. 1 and 2 specify the compositions of respective layers, which are determined by the correspondence between distribution of respective elements and the electron micrograph (SEM).

Reference numeral 1 denotes a base (cemented carbide), reference numeral 2 denotes a Ti-based layer of Ti$(C_{x1}N_{y1}O_{z1})$ ($0 \leq x1 \leq 1$, $0 \leq y1 \leq 1$, $0 \leq z1 \leq 1$, $x1+y1+z1=1$), reference numeral 2a denotes a first Ti-based layer of Ti$(C_{x11}N_{y11}O_{z11})$ ($0 \leq x11 \leq 1$, $0 \leq y11 \leq 1$, $0 \leq z11 \leq 1$, $x11+y11+z11=1$), reference numeral 2b denotes a second Ti-based layer of Ti$(C_{x12}N_{y12}O_{z12})$ ($0 \leq x12 \leq 1$, $0 \leq y12 \leq 1$, $0 \leq z12 \leq 1$, $x12+y12+z12=1$), reference numeral 4 denotes an intermediate layer of (Ti,Al) $(C_{x2}N_{y2}O_{z2})$ ($0 \leq x2 \leq 1$, $0 \leq y2 \leq 1$, $0 \leq z2 \leq 1$, $x2+y2+z2=1$), reference numeral 5 denotes an $Al_2O_3$ layer, reference numeral 6 denotes an outermost layer of Ti$(C_{x3}N_{y3}O_{z3})$ ($0 \leq x3 \leq 1$, $0 \leq y3 \leq 1$, $0 \leq z3 \leq 1$, $x3+y3+z3=1$), reference numeral 7 denotes a coating layer of the all layers laminated, and reference numeral 8 denotes a cutting tool, and apart of the cutting tool 8 is shown in FIG. 1.

It is to be noted that the intermediate layer 4 can be omitted. According to the present embodiment, the first Ti-based layer 2a on the side closer to the base 1 is a TiCN layer, and the second Ti-based layer 2b is also a TiCN layer that differs in CN ratio.

In this regard, while the thickness of the respective layers can be calculated in the GDS analysis, thickness errors of the respective layers are increased when etching rate is different for every layer. Thus, by confirming the compositions of the respective layers, and at the same time, the ranges of the respective layers were determined by confirming peak shapes of the GDS analysis data while checking the scanning electron microscope (SEM) photograph and electron probe microanalysis (EPMA) data (not shown). It is to be noted that as can be seen from the SEM photograph in FIG. 1(a), the thicknesses of the respective layers in the SEM photograph are partially not proportional to the thicknesses of the respective layers, which are detected by the GDA analysis. In addition, in the SEM photograph in FIG. 1(a), it can be confirmed that it is the TiCN layer as the first Ti-based layer 2a of the Ti-based layer 2 that has the largest film thickness, and it is the $Al_2O_3$ layer 5 that has the next largest film thickness, and from the peak shapes of the GDS analysis data in FIG. 1(b), it can be confirmed that there are a region where the Ti distribution remains at a high concentration and a region where the Al distribution remains at a high concentration. Further, the region where the Ti distribution remains at a high concentration is identified as a region of the first Ti-based layer 2a and a region of the second Ti-based layer 2b, whereas the region where the Al distribution remains at high concentration is identified as a region of the $Al_2O_3$ layer 5. Further, the thickness-center positions of the respective layers are identified as a center $L_{Ti}$ of the first Ti-based layer 2a and a center $L_{Al}$ of the $Al_2O_3$ layer 5. The intermediate layer 4 and the outermost layer 6 are determined by identifying the region of the Ti-based layer 2 composed of the first Ti-based layer 2a and the second Ti-based layer 2b and the region of the $Al_2O_3$ layer 5, and as for the center positions of the intermediate layer 4 and outermost layer 6, the center positions in the regions are identified as the center positions (not shown).

In this regard, the boundaries between the corresponding layers are regarded as flexion points at which the contents of respective elements change sharply. However, at boundaries where points at which the contents of respective elements change sharply are not able to be determined, the boundaries between the corresponding layers are identified by the following method. More specifically, the boundary between the region of the first Ti-based layer 2a and the region of the second Ti-based layer 2b is defined as a point at which the content of Ti is 10% lower with respect to the maximum of the Ti content in the region of the first Ti-based layer 2a. Likewise, the boundary between the region of the second Ti-based layer 2b and the region of the intermediate layer 4 is defined as a point at which the content of Ti is 10% lower with respect to the maximum of the Ti content in the region of the second Ti-based layer 2b. In addition, the boundary between the region of the intermediate layer 4 and the region of the $Al_2O_3$ layer 5 is defined as a point at which the content of Al is 10% lower with respect to the maximum of the Al content in the $Al_2O_3$ layer 5.

In addition, in the GDS analysis, the coating layer has a wide measurement field on the order of 1 mm in an in-plane direction, and thus, when depressions and protrusions exist between each of the layers, constituents in other layers adjacent to the respective layers may be mixed and detected. In addition, depending on differences in etching rate between each of the layers, the constituents contained in the base 1 are mixed in the region identified as the first Ti-based layer 2a on the side closer to the base in the GDS analysis. In addition, the constituents contained in the Ti-based layer 2 as a lower layer are mixed in the region identified as the intermediate layer 4 on the side closer to the base, and the constituents contained in the $Al_2O_3$ layer 5 as an upper layer are mixed and detected in the region identified as the intermediate layer 4 on the surface side. As a result, the region of the intermediate layer 4 in the GDS analysis is observed widely more than the actual thickness observed in the SEM photograph.

In this regard, a preferred example of the base 1 is formed from a WC phase, a bonded phase, and if necessary, a B1-type solid solution phase. Further, the example contains WC in a proportion of 80 to 94 mass %, Co in a proportion of 5 to 15 mass %, Cr in a proportion of 0.1 to 1 mass % in terms of $Cr_3C_2$, and at least one of a carbide (excluding WC), a nitride, and a carbonitride of at least one selected from the group of metals in Groups 4, 5, and 6 of the periodic table, excluding Cr, in a proportion of 0 to 10 mass %.

According to the present embodiment, the coating layer 7 of the Ti-based layer 2, intermediate layer 4, $Al_2O_3$ layer 5, and outermost layer 6 laminated in order from the side of the base 1 is provided on the surface of the base 1. In the glow-discharge emission spectrometry (GDS analysis) in FIG. 2, the content of Cr contained at the thickness-center point of the first Ti-based layer 2a in the Ti-based layer 2 on the side closer to the base 1 is lower than the content of Cr contained in the base 1, and higher than the content of Cr contained at the thickness-center point of the $Al_2O_3$ layer 5. Furthermore, the content of Cr contained at the thickness-center point of the outermost layer 6 is higher than the content of Cr contained at the thickness-center point of the $Al_2O_3$ layer.

This improves the oxidation resistance of the first Ti-based layer 2a and outermost layer 6 containing Ti, and further in some cases, of the second Ti-based layer 2b. As a result, even in processing in which a cutting edge reaches high temperatures, such as high-speed cutting, the decrease in hardness by oxidation of the coating layer 7 can be suppressed to enhance the wear resistance of the cutting tool 8. In addition, the $Al_2O_3$ layer 5 has the effect of improving the wear resistance, because the content of Cr is lower as compared with those in the other layers. Furthermore, the outermost layer 6 also has, because of containing Cr, the effect of enhancing the weld resistance at the surface of the coating layer 7.

More specifically, when the content of Cr contained at the thickness-center point of the first Ti-based layer 2a is equal to or lower than the content of Cr contained at the thickness-center point of the $Al_2O_3$ layer 5, the oxidation of the coating layer 7 has a tendency to proceed. When the content of Cr contained at the thickness-center point of the $Al_2O_3$ layer 5 is equal to or higher than the content of Cr contained at the thickness-center point of the first Ti-based layer 2a or at the thickness-center point of the outermost layer 6, the wear resistance of the $Al_2O_3$ layer 5 has a tendency to decrease. When the content of Cr contained at the thickness-center point of the outermost layer 6 is equal to or lower than the content of Cr contained at the thickness-center point of the $Al_2O_3$ layer 5, the weld resistance of the coating layer 7 has a tendency to decrease.

According to the present embodiment, furthermore, when the ratios of the contents of Cr contained at the thickness-center positions of the respective layers of the first Ti-based layer 2a, $Al_2O_3$ layer 5, and outermost layer 6 to the content of Cr contained in the base 1 are respectively represented by $Cr_{Ti}$, $Cr_{Al}$, and $Cr_s$, the following conditions are met: $0.5 \leq Cr_{Ti} \leq 0.9$; $0.01 \leq Cr_{Al} \leq 0.2$; and $0.4 \leq Cr_s \leq 0.7$. In this regard, the content of Cr contained in the base 1 is measured in the region where the change rates of the W and C contents fall within 5% in the GDS analysis data.

This improves the oxidation resistance of the first Ti-based layer 2a, second Ti-based layer 2b, and further, outermost layer 6 containing Ti, and even in processing in which a cutting edge reaches high temperatures, such as high-speed cutting, the decrease in hardness due to oxidation of the coating layer 7 can be suppressed to enhance the wear resistance of the cutting tool 8. It is to be noted that the coating layer with the intermediate layer 4 omitted therefrom can also achieve a similar effect.

Furthermore, according to the present embodiment, when the ratio of the content of Cr contained at the thickness-center position of the intermediate layer 4 to the content of Cr contained in the base 1 is represented by $Cr_m$, the following condition is met: $0.2 \leq Cr_m \leq 0.5$. This improves the oxidation resistance of the intermediate layer 4.

In this regard, the coating layer 7 contains therein W and Co besides Cr. According to the present embodiment, when the ratios of the contents of W and Co contained in the respective layers of the first Ti-based layer 2a, $Al_2O_3$ layer 5, and outermost layer 6 to the contents of W and Co contained in the base 1 are respectively represented by $W_{Ti}$, $W_{Al}$, $W_s$, $Co_{Ti}$, $Co_{Al}$, and $Co_s$, the following conditions are met: $0.05 \leq W_{Ti} \leq 0.3$; $W_{Al} \leq 0.01$; $W_s \leq 0.01$; $0.05 \leq Co_{Ti} \leq 0.3$; $Co_{Al} \leq 0.01$; and $Co_s \leq 0.01$. More specifically, the W and Co which diffuse from the base 1 can diffuse into the Ti-based layer 2 to further enhance the adhesion between the base 1 and the coating layer 7. However, the W and Co are likely to be oxidized at high temperature, and thus hardly diffuse into the $Al_2O_3$ layer 5 and the outermost layer 6, thereby making it possible to suppress the oxidation of the coating layer 7.

In this case, when the ratios of the contents of W and Co contained in the intermediate layer 4 to the contents of W and Co contained in the base 1 are respectively represented by $W_m$ and $Co_m$, the following conditions are met: $W_m \leq 0.05$ and $Co_m \leq 0.05$. More specifically, the W and Co which diffuse from the base 1 hardly diffuse into the intermediate layer 4, thereby making it possible to suppress the oxidation of the coating layer 7.

In addition, according to the present embodiment, the base 1 contains therein Si and Fe as unavoidable impurity constituents, which diffuse into the coating layer 7. When the ratios of the contents of Si and Fe contained in the respective layers of the first Ti-based layer 2a, $Al_2O_3$ layer 5, and outermost layer 6 to the contents of Si and Fe contained in the base 1 are respectively represented by $Si_{Ti}$, $Si_{Al}$, $Si_s$, $Fe_{Ti}$, $Fe_{Al}$, and $Fe_s$, the following conditions are met: $0.05 \leq Si_{Ti} \leq 0.4$; $Si_{Al} \leq 0.01$; $Si_s \leq 0.01$; $0.05 \leq Fe_{Ti} \leq 0.4$; $Fe_{Al} \leq 0.01$; and $Fe_s \leq 0.01$. More specifically, the Si and Fe which diffuse from the base 1 can diffuse into the Ti-based layer 2 to further enhance the adhesion between the base 1 and the coating layer 7. However, the Si and Fe are likely to be oxidized at high temperature, and thus hardly diffuse into the $Al_2O_3$ layer 5 and the outermost layer 6, thereby making it possible to suppress the oxidation of the coating layer 7.

In this case, according to the present embodiment, when the ratios of the contents of Si and Fe contained in the intermediate layer 4 to the contents of Si and Fe contained in the base 1 are respectively represented by $Si_m$ and $Fe_m$, the following conditions are met: $Si_m \leq 0.05$ and $Fe_m \leq 0.05$. More specifically, the Si and Fe which diffuse from the base 1 hardly diffuse into the intermediate layer 4, thereby making it possible to suppress the oxidation of the coating layer 7.

Furthermore, according to the present embodiment, the base 1 and the coating layer 7 contain therein C (carbon). When the ratios of the contents of C contained in the respective layers of the first Ti-based layer 2a, intermediate layer 4, $Al_2O_3$ layer 5, and outermost layer 6 to the content of C contained in the base 1 are respectively represented by $C_{Ti}$, $C_m$, $C_{Al}$, and $C_s$, the following conditions are met: $0.2 \leq C_{Ti} \leq 0.7$; $0.01 \leq C_m \leq 0.18$; $C_{Al} \leq 0.01$; and $C_s \leq 0.30$. The adhesion between the base 1 and the coating layer 7 can be further enhanced by controlling the C content in the coating layer 7. A further desirable range of $C_{Ti}$ is $0.3 \leq C_{Ti} \leq 0.6$.

It is to be noted that while the Ti-based layer 2 according to the present embodiment has the first Ti-based layer 2a on the side closer to the base 1 and the second Ti-based layer 2b which are both TiCN layers, and has the multiple layers laminated, the Ti-based layer may be a single layer, or a multilayer of three or more layers. This composition makes it possible to easily adjust the degrees of diffusion of respective constituents of Cr, W, Co, Fe, Si, and C into the coating layer 7.

(Production Method)

An example of a method for producing the cemented carbide constituting the above-described cutting tool according to the present embodiment will be described. First, a WC powder, a metal Co powder, a $Cr_3C_2$ powder, and if necessary, a compound powder containing other metal constituent are prepared respectively in proportions of: 80 to 94 mass %; 5 to 15 mass %; 0.1 to 1 mass %; and 0 to 10 mass % or less.

This prepared powders are, with the addition of a solvent thereto, subjected to mixing and grinding for a predetermined period of time, thereby providing slurry. This slurry is further mixed with the addition of a binder thereto, and the mixed power is subjected to granulation while drying the slurry with the use of a spray dryer or the like. Next, with the use of the granulated powder, molding is carried out by press molding into a shape of a cutting tool. Further, after degreasing in a sintering furnace, the temperature in the sintering furnace is increased to a sintering temperature of 1380 to 1480° C. for sintering for 1 to 1.5 hours in a reduced atmosphere of 20 to 2000 Pa, thereby making it possible to prepare a cemented carbide.

Then, for the cemented carbide prepared, if necessary, the surface of the cemented carbide is subjected to polishing, and a cutting part is subjected to honing. Thereafter, the base of the cemented carbide is subjected to an acid treatment or an alkali treatment to remove contamination on the surface of the base, a solution is prepared which contains a $Cr_3C_2$ powder or metal chromium (Cr), and the Cr constituent is attached to the surface of the base by a spray method, an impregnation method, or a coating method, thereby increasing the Cr concentration.

Next, the coating layer 2 is formed by a chemical vapor deposition (CVD) method on the surface of the base obtained. To describe an example of the deposition condition, first, a TiN (titanium nitride) layer as a first Ti-based layer is formed on the surface of the base, if necessary. Preferred deposition conditions therefor include: the use of a mixed gas containing, as a mixed gas composition, a titanium tetrachloride ($TiCl_4$) gas in a proportion of 0.5 to 10 volume % and a nitrogen ($N_2$) gas in a proportion of 10 to 60 volume %, and including a hydrogen ($H_2$) gas as a balance; the deposition temperature from 800 to 940° C.; and the pressure from 8 to 50 kPa.

Next, a TiCN layer as a second Ti-based layer is formed on the top of the TiN layer. Deposition conditions therefor include: the use of a mixed gas containing, as a mixed gas composition, a titanium tetrachloride ($TiCl_4$) gas in a proportion of 0.5 to 10 volume %, a nitrogen ($N_2$) gas in a proportion of 1 to 60 volume %, and an acetonitrile ($CH_3CN$) gas in a proportion of 0.1 to 3.0 volume %, and including a hydrogen ($H_2$) gas as a balance; the deposition temperature from 780 to 850° C.; and the pressure from 5 to 25 kPa, and under the conditions, a MT (Moderate Temperature) —TiCN layer is deposited which is composed of so-called columnar crystals. The crystal widths of the columnar crystals can be adjusted by increasing or decreasing the flow rate of the acetonitrile ($CH_3CN$) gas during the deposition. Then, a HT (High Temperature)-TiCN layer composed of so-called grained crystals is formed on the top of the MT-TiCN layer. Specifically, subsequent to the TiCN layer mentioned above, the HT-TiCN layer is deposited by switching to deposition conditions of: the use of a mixed gas containing a titanium tetrachloride ($TiCl_4$) gas in a proportion of 0.1 to 3 volume %, a nitrogen ($N_2$) gas in a proportion of 0 to 15 volume %, and a methane ($CH_4$) gas or an acetonitrile ($CH_3CN$) gas in a proportion of 0.1 to 10 volume %, and including a hydrogen ($H_2$) gas as a balance; the deposition temperature from 900 to 1020° C.; and the pressure from 5 to 40 kPa.

Subsequently, an intermediate layer is deposited. Specific deposition conditions for the deposition of the TiAlCNO layer include: as an example, the use of a mixed gas containing a titanium tetrachloride ($TiCl_4$) gas in a proportion of 0.1 to 3 volume %, a nitrogen ($N_2$) gas in a proportion of 1 to 15 volume %, a methane ($CH_4$) gas or an acetonitrile ($CH_3CN$) gas in a proportion of 0.1 to 10 volume %, a carbon monoxide (CO) gas in a proportion of 0.5 to 3.0 volume %, and aluminum trichloride ($AlCl_3$) in a proportion of 0.5 to 3.0 volume %, and including a hydrogen ($H_2$) gas as a balance; the deposition temperature from 900 to 1020° C.; and the pressure from 5 to 40 kPa.

Thereafter, an α-type $Al_2O_3$ layer is continuously formed. Specific deposition conditions include: as an example, the use of a mixed gas containing an aluminum trichloride ($AlCl_3$) gas in a proportion of 0.5 to 5.0 volume %, a hydrogen chloride (HCl) gas in a proportion of 0.5 to 3.5 volume %, a carbon dioxide ($CO_2$) gas in a proportion of 0.5 to 5.0 volume %, and a hydrogen sulfide ($H_2S$) gas in a proportion of 0 to 0.5 volume %, and including a hydrogen ($H_2$) gas as a balance; the deposition temperature from 930 to 1010° C.; and the pressure from 5 to 10 kPa.

Then, if necessary, an outermost layer is deposited on the surface of the $Al_2O_3$ layer. Specific deposition conditions in the case of depositing a TiN layer as the outermost layer include: the use of a mixed gas containing, as a mixed gas composition, a titanium tetrachloride ($TiCl_4$) gas in a proportion of 0.1 to 10 volume %, a chromium dichloride ($CrCl_2$) gas in a proportion of 0.005 to 0.025 volume o, and a nitrogen ($N_2$) gas in a proportion of 1 to 60 volume o, and including a hydrogen ($H_2$) gas as a balance; the deposition temperature from 855 to 1010° C.; and the pressure from 10 to 85 kPa.

Then, after completing the deposition of the coating layer, the inside of the deposition chamber is kept at a pressure of 350 kPa to 850 kPa and a temperature of 1000 to 1200° C. for 30 minutes to 120 minutes, and the inside of the chamber is cooled to cause the Cr constituent present on the base surface, and the W, Co, Fe, Si, and C constituents to diffuse toward the coating layer, thereby providing the constituents contained in predetermined proportions in the Ti-based layer, the intermediate layer, and the $Al_2O_3$ layer. As for the outermost layer, the flow of a raw material gas containing the Cr constituent during the deposition mentioned above causes the outermost layer to contain therein the Cr constituent.

Thereafter, if necessary, at least a cutting part of the surface of the coating layer formed is subjected to polishing. This polishing smooths the cutting part, and suppresses welding of work materials, thereby providing a tool which is further excellent in defect resistance.

EXAMPLE

To a WC powder of 5 μm in mean particle size, a metal Co powder of 1.5 μm in mean particle size, a TiC powder of 1.0 μm in mean particle size, a NbC powder of 1.0 μm in mean particle size, a ZrC powder of 2.0 μm in mean particle size, and a $Cr_3C_2$ powder of 2.0 μm in mean particle size, were prepared and added respectively in proportions of 8 mass %, 0.8 mass %, 3.5 mass %, 0.3 mass %, and 0.6 mass % such that the total of the raw materials accounted for 100 mass %, with the addition of an organic solvent thereto, subjected to mixing and grinding, and then further mixed with the addition of a shape retaining agent, and the produced slurry was put into a spray dryer to prepare a granulated powder. Next, with the use of the granulated powder, molding is carried out by press molding into a cutting tool shape (CNMG120408PS), and a cemented carbide was prepared by sintering for one hour at 1450° C. after degreasing for three hours at 450° C. in a sintering furnace.

Then, the cemented carbide was subjected to grinding into a substantially plate shape of CNMG120408PS, and the surface of the base was then further subjected to honing at a cutting part. Then, with the use of the slurry containing $Cr_3C_2$, a surface treatment was implemented in accordance with the method in Table 2 for carrying out a treatment for increasing the Cr concentration at the base surface, thereby increasing the content of Cr at the surface of the base.

Furthermore, on the surface of the processed cemented carbide, coating layers composed in accordance with Tables 2 to 5 were sequentially deposited under the deposition conditions in Table 1 by a chemical vapor deposition (CVD) method. It is to be noted that for the Ti-based layer, a TiN layer was deposited as the first Ti-based layer, whereas a MT-TiCN layer and a HT-TiCN layer were laminated for the second Ti-based layer. For the thickness of the second Ti-based layer, the thickness of the HT-TiCN layer was made constant at 0.5 μm, whereas the thickness of the MT-TiCN layer was adjusted such that the total thickness reached the thickness in Table 2. In addition, for sample No. 9, the outermost layer was deposited without adding a chromium chloride ($CrCl_4$) gas to the mixed gas in the deposition of the outermost layer, and for sample No. 12, the outermost layer was deposited with the addition of a chromium chloride ($CrCl_4$) gas to the mixed gas in the deposition of the outermost layer only for the latter half of the deposition time. After the deposition, the chamber was filled with a $N_2$ gas so as to reach 500 kPa, and cooled after going through a post-deposition high-temperature holding step for holding at the temperature shown in Table 2 for 60 minutes. It is to be noted that the thicknesses of the respective layers were confirmed by observing a cross section of the coating layer with a scanning electron microscope.

TABLE 1

| Coating Layer | Mixed Gas Composition (volume %) | Deposition Temperature (° C.) | Pressure (kPa) |
|---|---|---|---|
| TiN (First Ti-Based Layer) | $TiCl_4$: 2.5, $N_2$: 23, $H_2$: balance | 900 | 16 |
| TiCN-MT (First Ti-Based Layer) | $TiCl_4$: 1.0, $N_2$: 10, $CH_3CN$: 0.1→0.4, $H_2$: balance | 850 | 9 |

TABLE 1-continued

| Coating Layer | Mixed Gas Composition (volume %) | Deposition Temperature (° C.) | Pressure (kPa) |
|---|---|---|---|
| TiCN-HT (Second Ti-Based Layer) | $TiCl_4$: 1.0, $N_2$: 10, $CH_4$: 2.0, $H_2$: balance | 1010 | 9 |
| TiAlCNO | $TiCl_4$: 7.0, $CH_4$: 5.5, $N_2$: 5.0, CO: 0.5, $AlCl_3$: 1.5, $H_2$: balance | 1000 | 15 |
| TiNO | $TiCl_4$: 7.0, $N_2$: 7.0, CO: 0.5, $H_2$: balance | 1000 | 15 |
| TiCNO | $TiCl_4$: 7.0, $CH_4$: 5.5, $N_2$: 5.0, CO: 0.5, $H_2$: balance | 1000 | 15 |
| $Al_2O_3$ | $AlCl_3$: 7.0, HCl: 0.5, $CO_2$: 1.0, $H_2$: balance | 1000 | 10 |
| TiCN (Outermost Layer) | $TiCl_4$: 2.0, $N_2$: 20, $CH_4$: 5.0, $CrCl_4$: 0.05, $H_2$: balance | 1010 | 80 |
| TiN (Outermost Layer) | $TiCl_4$: 2.0, $N_2$: 44, $CrCl_4$: 0.05, $H_2$: balance | 1010 | 80 |

*TiCN1(MT):
The mixed amount of $CH_3CN$ in the mixed gas was changed continuously from 0.1 to 0.4 volume %.

The obtained cutting tool was subjected to a GDS analysis (GD-PROFTLER from HORIBA, Ltd.; analysis conditions: power 20 W, Ar pressure 600 Pa, discharge range 2 mmφ, sampling time 0.3 sec/point) for the change in composition in the depth direction from the surface, thereby confirming the distribution of respective elements of Cr, W, Co, Fe, Si, and C in the centers of each of the layers, and the concentrations of the respective elements are shown in Tables 2 to 5. In addition, a cross section of the cutting tool was observed with a SEM.

TABLE 2

| Sample No. | Surface Treatment | Holding Temperature (° C.) | Coating Layer (Composition: Thickness (μm)), Content Rate of Each Element[1] | | $Cr_{Ti}$ | $W_{Ti}$ | $Co_{Ti}$ | $Si_{Ti}$ | $Fe_{Ti}$ | $C_{Ti}$ |
|---|---|---|---|---|---|---|---|---|---|---|
| | | | Ti-Based Layer | | | | | | | |
| 1 | Spray | 1000 | TiCN: 10 | TiCN: 0.2 | 0.87 | 0.16 | 0.10 | 0.18 | 0.29 | 0.46 |
| 2 | Coating | 1100 | TiCN: 8 | TiCN: 0.6 | 0.90 | 0.12 | 0.08 | 0.14 | 0.15 | 0.54 |
| 3 | Spray | 1200 | TiCN: 12 | TiCN: 0.5 | 0.67 | 0.18 | 0.15 | 0.19 | 0.32 | 0.32 |
| 4 | Impregnation | 1100 | TiCN: 8 | TiCN: 0.5 | 0.50 | 0.21 | 0.22 | 0.30 | 0.35 | 0.52 |
| 5 | Spray | 900 | TiCN: 10 | — | 1.00 | 0.29 | 0.28 | 0.35 | 0.29 | 0.15 |
| 6 | — | 1100 | TiCN: 10 | TiCN: 0.5 | 0.13 | 0.44 | 0.80 | 0.17 | 0.13 | 0.62 |
| 7 | Coating | 1250 | TiCN: 10 | TiCN: 0.5 | 0.90 | 0.34 | 0.30 | 0.33 | 0.42 | 0.78 |
| 8 | Spray | — | TiCN: 10 | TiCN: 0.5 | 0.23 | 0.28 | 0.31 | 0.51 | 0.41 | 0.25 |
| 9 | Spray | 1000 | TiCN: 10 | TiCN: 0.2 | 0.87 | 0.16 | 0.10 | 0.18 | 0.29 | 0.60 |
| 10 | Coating | 1100 | TiCN: 8 | — | 0.75 | 0.12 | 0.08 | 0.14 | 0.15 | 0.58 |
| 11 | Spray | 1000 | TiCN: 10 | TiCN: 0.7 | 0.45 | 0.22 | 0.19 | 0.28 | 0.23 | 0.45 |
| 12 | Spray | 1000 | TiCN: 10 | TiCN: 0.5 | 0.70 | 0.30 | 0.06 | 0.08 | 0.09 | 0.48 |

[1]Content Rate of Each Element: ratio obtained when the proportion of presence inside of the base is regarded as 1

TABLE 3

| Sample No. | Coating Layer (Composition: Thickness (μm)), Content Rate of Each Element[1] | | | | | | |
|---|---|---|---|---|---|---|---|
| | Intermediate Layer | $Cr_m$ | $W_m$ | $Co_m$ | $Si_m$ | $Fe_m$ | $C_m$ |
| 1 | TiAlCNO: 0.5 | 0.37 | <0.01 | 0.01 | 0.01 | 0.03 | 0.16 |
| 2 | TiAlNO: 1.0 | 0.45 | <0.01 | <0.01 | <0.01 | 0.02 | 0.01 |
| 3 | TiNO: 0.3 | 0.31 | 0.01 | 0.02 | 0.02 | 0.04 | 0.02 |
| 4 | TiCNO: 0.5 | 0.28 | 0.02 | 0.02 | 0.03 | 0.05 | 0.14 |
| 5 | TiAlCNO: 0.5 | 0.33 | 0.11 | 0.08 | 0.19 | 0.17 | 0.13 |
| 6 | TiAlNO: 0.3 | 0.13 | 0.06 | 0.03 | 0.02 | 0.02 | 0.01 |
| 7 | TiAlCNO: 0.2 | 0.63 | 0.23 | 0.21 | 0.13 | 0.11 | 0.14 |
| 8 | TiAlCNO: 0.3 | 0.13 | 0.03 | 0.03 | 0.04 | 0.04 | 0.15 |
| 9 | TiAlCNO: 0.5 | 0.37 | <0.01 | 0.01 | 0.01 | 0.03 | 0.14 |
| 10 | TiNO: 1.0 | 0.41 | <0.01 | <0.01 | 0.01 | 0.02 | 0.05 |
| 11 | TiCNO: 0.5 | 0.27 | 0.09 | 0.06 | 0.14 | 0.15 | 0.13 |
| 12 | TiCNO: 0.5 | 0.22 | <0.01 | 0.01 | 0.01 | 0.02 | 0.15 |

[1]Content Rate of Each Element: ratio obtained when the proportion of presence inside of the base is regarded as 1

TABLE 4

| Sample No. | Coating Layer (Composition: Thickness (μm)), Content Rate of Each Element[1] | | | | | | |
|---|---|---|---|---|---|---|---|
| | $Al_2O_3$ Layer | $Cr_{Al}$ | $W_{Al}$ | $Co_{Al}$ | $Si_{Al}$ | $Fe_{Al}$ | $C_{Al}$ |
| 1 | α type: 3.0 | 0.14 | <0.01 | <0.01 | <0.01 | <0.01 | <0.01 |
| 2 | α type: 3.5 | 0.16 | <0.01 | <0.01 | <0.01 | <0.01 | <0.01 |
| 3 | α type: 2.5 | 0.12 | <0.01 | <0.01 | <0.01 | <0.01 | <0.01 |
| 4 | κ type: 3.0 | 0.09 | <0.01 | <0.01 | <0.01 | <0.01 | <0.01 |
| 5 | α type: 3.0 | 0.15 | 0.02 | 0.01 | 0.01 | 0.01 | <0.01 |
| 6 | α type: 3.0 | 0.22 | 0.01 | 0.01 | 0.01 | 0.03 | <0.01 |
| 7 | α type: 3.0 | 0.53 | 0.13 | 0.16 | 0.08 | 0.04 | <0.01 |
| 8 | α type: 2.0 | 0.23 | 0.02 | 0.02 | 0.04 | 0.03 | <0.01 |
| 9 | α type: 3.0 | 0.14 | <0.01 | <0.01 | <0.01 | <0.01 | <0.01 |
| 10 | α type: 3.5 | 0.22 | <0.01 | <0.01 | <0.01 | <0.01 | <0.01 |
| 11 | α type: 3.0 | 0.13 | 0.02 | 0.01 | 0.01 | 0.01 | <0.01 |
| 12 | α type: 3.0 | 0.14 | <0.01 | <0.01 | <0.01 | <0.01 | <0.01 |

[1]Content Rate of Each Element: ratio obtained when the proportion of presence inside of the base is regarded as 1

TABLE 5

| Sample No. | Coating Layer (Composition: Thickness (μm)), Content Rate of Each Element[1] | | | | | | |
|---|---|---|---|---|---|---|---|
| | Surface Layer | $Cr_s$ | $W_s$ | $Co_s$ | $Si_s$ | $Fe_s$ | $C_s$ |
| 1 | TiCN: 0.5 TiN: 0.5 | 0.53 | <0.01 | <0.01 | <0.01 | <0.01 | 0.05 |
| 2 | TiN: 0.5 | 0.50 | <0.01 | <0.01 | <0.01 | <0.01 | <0.01 |
| 3 | TiN1.0 | 0.45 | <0.01 | <0.01 | <0.01 | <0.01 | <0.01 |
| 4 | TiCN: 0.5 | 0.61 | <0.01 | <0.01 | <0.01 | <0.01 | 0.25 |
| 5 | TiCN: 0.5 | 0.60 | <0.01 | <0.01 | <0.01 | <0.01 | 0.28 |
| 6 | TiCN: 0.5 | 0.84 | 0.03 | 0.03 | 0.04 | 0.12 | 0.32 |
| 7 | TiN: 0.5 | 0.50 | 0.02 | 0.02 | 0.01 | 0.01 | <0.01 |
| 8 | TiN: 0.5 | 0.50 | <0.01 | <0.01 | <0.01 | <0.01 | <0.01 |

TABLE 5-continued

Coating Layer (Composition: Thickness (μm)), Content Rate of Each Element[1]

| Sample No. | Surface Layer | $Cr_s$ | $W_s$ | $Co_s$ | $Si_s$ | $Fe_s$ | $C_s$ |
|---|---|---|---|---|---|---|---|
| 9 | TiN: 0.5 | 0.10 | <0.01 | <0.01 | <0.01 | <0.01 | <0.01 |
| 10 | TiCN: 0.5 | 0.65 | <0.01 | <0.01 | <0.01 | <0.01 | 0.22 |
| 11 | TiN: 0.5 | 0.60 | <0.01 | <0.01 | <0.01 | <0.01 | <0.01 |
| 12 | TiN: 0.5 | 0.32 | <0.01 | <0.01 | <0.01 | <0.01 | <0.01 |

[1]Content Rate of Each Element: ratio obtained when the proportion of presence in the base is regarded as 1

Then, the wear resistance and the defect resistance were evaluated by carrying out a continuous cutting test and a strong intermittent cutting test under the following conditions with the use of the tools.
(Wear Evaluation Condition)
Work Material: SCM435
Tool Shape: CNMG120408PS
Cutting Rate: 300 m/min
Feed Rate: 0.3 mm/rev
Cut: 2.0 mm (cutting varied for every 3-second cutting)
Cutting Time: 15 minutes
Cutting Fluid: Emulsion 15%+Water 85% Mixed Fluid
Evaluation Item: Observation of Cutting Edge with Microscope and Measurement of Flank Wear Volume and Nose Wear Volume
(Strong Intermittent Cutting Condition)
Work Material: SCM440, material with four grooves therein
Tool Shape: CNMG120408PS
Cutting Rate: 300 m/min
Feed Rate: 0.35 mm/rev
Cut: 1.5 mm
Cutting Fluid: Emulsion 15%+Water 85% Mixed Fluid
Evaluation Item: The Number of Shocks leading to Defect Observation of Cutting Edge Condition with Microscope at the time of the Number of Shocks: 1000 times
The results are shown in Table 6.

TABLE 6

| | Wear Test | | Strong Intermittent Test | |
|---|---|---|---|---|
| Sample No. | Flank Face Wear Volume (mm) | Cutting Edge Condition | The Number of Shocks (times) | Cutting Edge Condition |
| 1 | 0.10 | Normal | 2134 | Normal |
| 2 | 0.11 | Normal | 2320 | Normal |
| 3 | 0.11 | Normal | 1802 | Normal |
| 4 | 0.16 | Wearing | 1768 | Normal |
| 5 | 0.26 | Wearing increased | 1879 | Coating layer peeled |
| 6 | 0.28 | Wearing increased | 1560 | Chipping increased |
| 7 | 0.33 | Wearing increased | 1720 | Normal |
| 8 | 0.30 | Wearing increased | 1750 | Coating layer peeled |
| 9 | 0.24 | Welding | 1730 | Chipping increased |
| 10 | 0.20 | Wearing | 1780 | Chipping |
| 11 | 0.21 | Wearing | 1800 | Normal |
| 12 | 0.22 | Welding | 1810 | Normal |

From the results shown in Tables 1 to 6, in the case of the sample No. 5 without any TiN layer formed on the surface of the base, with $Cr_{Ti}$ equal to the Cr content in the base, the coating layer was peeled in the strong intermittent test. In addition, in the case of the sample No. 6 without any Cr attached to the surface of the base and the sample No. 8 subjected to no heat treatment after the deposition, with the $Cr_{Ti}$ equal to or smaller than $Cr_{Al}$, the wear resistance was decreased. Moreover, in the case of the sample No. 7 subjected to the high heat treatment temperature after the deposition, with $Cr_s$ smaller than $Cr_{Al}$, the wear resistance of the coating layer was decreased. In addition, in the case of the sample No. 9 with $Cr_s$ smaller than 0.4 in the outermost layer, the coating layer was welded, thereby decreasing the wear resistance.

In contrast, in the case of the samples Nos. 1 to 4 and 10 to 12 with the TiN layer, TiCN layer, and $Al_2O_3$ layer sequentially laminated, and with $Cr_{Ti}$ smaller than the Cr content of the base, larger $Cr_{Al}$, and $Cr_{Al}$ smaller than $Cr_s$ in the GDS analysis, in each case, the coating layer was high in adhesion force, and the cutting performance was excellent in wear resistance. In particular, in the case of the samples Nos. 1 to 4 with the conditions of $0.5 \leq Cr_{Ti} \leq 0.9$, $0.01 \leq Cr_{Al} \leq 0.2$, and $0.4 \leq Cr_s \leq 0.7$ met, the wear resistance was particularly high.

REFERENCE SIGNS LIST

1: base (cemented carbide)
2: Ti-based layer
2a: first Ti-based layer
2b: second Ti-based layer
4: intermediate layer
5: $Al_2O_3$ layer
6: outermost layer
7: coating layer
8: cutting tool

The invention claimed is:

1. A cutting tool comprising:
a base including cemented carbide containing W, C, Co, Cr, Si and Fe; and
a coating layer comprising a Ti-based layer including at least a layer of $Ti(C_{x1}N_{y1}O_{z1})$ ($0 \leq x1 \leq 1$, $0 \leq y1 \leq 1$, $0 \leq z1 \leq 1$, $x1+y1+z1=1$), an Al2O3 layer, and an outermost layer of $Ti(C_{x3}N_{y3}O_{z3})$ ($0 \leq x3 \leq 1$, $0 \leq y3 \leq 1$, $0 \leq z3 \leq 1$, $x3+y3+z3=1$), which are laminated in order from the base side on a surface of the base, wherein a content of Cr contained at a thickness-center position of a first Ti-based layer of the Ti-based layer on a side closer to the base is lower than a content of Cr contained in the base, and higher than a content of Cr contained at a thickness-center position of the $Al_2O_3$ layer, and a content of Cr contained at a thickness-center position of the outermost layer is higher than the content of Cr contained at the thickness-center position of the $Al_2O_3$ layer in a glow-discharge emission spectrometry (GDS analysis).

2. The cutting tool according to claim 1, wherein when ratios of the contents of Cr contained at the thickness-center positions of the respective layers of the first Ti-based layer, the $Al_2O_3$ layer, and the outermost layer to the content of Cr contained in the base are respectively represented by $Cr_{Ti}$, $Cr_{Al}$, and $Cr_s$, the following conditions are met: $0.5 \leq Cr_{Ti} \leq 0.9$; $0.01 \leq Cr_{Al} \leq 0.2$; and $0.4 \leq Cr_s \leq 0.7$ in the glow-discharge emission spectrometry.

3. The cutting tool according to claim 2, wherein when ratios of contents of W and Co contained in the respective layers of the first Ti-based layer, the $Al_2O_3$ layer, and the outermost layer to contents of W and Co contained in the base are respectively represented by $W_{Ti}$, $W_{Al}$, $W_s$, $Co_{Ti}$, $Co_{Al}$, and $Co_s$, the following conditions are met:

$0.05 \leq W_{Ti} \leq 0.3$; $W_{Al} \leq 01$; $W_s \leq 0.01$; $0.05 \leq Co_{Ti} \leq 0.3$; $Co_{Al} \leq 0.01$; and $Co_s \leq 0.01$ in the glow-discharge emission spectrometry.

4. The cutting tool according to claim 2, wherein Si and Fe are contained in the base, and when ratios of contents of Si and Fe contained in the respective layers of the first Ti-based layer, the $Al_2O_3$ layer, and the outermost layer to contents of Si and Fe contained in the base are respectively represented by $Si_{Ti}$, $Si_{Al}$, $Si_s$, $Fe_{Ti}$, $Fe_{Al}$, and $Fe_s$, the following conditions are met: $0.05 \leq Si_{Ti} \leq 0.4$; $Si_{Al} \leq 0.01$; $Si_s \leq 0.01$; $0.05 \leq Fe_{Ti} \leq 0.4$; $Fe_{Al} \leq 0.01$; and $Fe_s \leq 0.01$ in the glow-discharge emission spectrometry.

5. The cutting tool according to claim 2, wherein when ratios of contents of C contained in the respective layers of the first Ti-based layer, the $Al_2O_3$ layer, and the outermost layer to a content of C contained in the base are respectively represented by $C_{Ti}$, $C_{Al}$, and $C_s$, the following conditions are met: $0.2 \leq C_{Ti} \leq 0.7$; $C_{Al} \leq 0.01$; and $C_s \leq 0.30$ in the glow-discharge emission spectrometry.

6. The cutting tool according to claim 1, wherein the coating layer further comprises an intermediate layer of $(Ti,Al)(C_{x2}N_{y2}O_{z2})$ ($0 \leq x2 \leq 1$, $0 \leq y2 \leq 1$, $0 \leq z2 \leq 1$, $x2+y2+z2=1$) between the Ti-based layer and the Al2O3 layer.

7. The cutting tool according to claim 6, wherein when a ratio of a content of Cr contained at a thickness-center position of the intermediate layer to the content of Cr contained in the base is represented by $Cr_m$, the following condition is met: $0.2 \leq Cr_m \leq 0.5$ in the glow-discharge emission spectrometry.

8. The cutting tool according to claim 6, wherein when ratios of contents of W and Co contained in the intermediate layer to contents of W and Co contained in the base are respectively represented by $W_m$ and $Co_m$, the following conditions are met: $W_m \leq 0.05$ and $Co_m \leq 0.05$ in the glow-discharge emission spectrometry.

9. The cutting tool according to claim 6, wherein when ratios of contents of Si and Fe contained in the intermediate layer to contents of Si and Fe contained in the base are respectively represented by $Si_m$ and $Fe_m$, the following conditions are met: $Si_m \leq 0.05$ and $Fe_m \leq 0.05$ in the glow-discharge emission spectrometry.

10. The cutting tool according to claim 6, wherein when a ratio of a content of C contained in the intermediate layer to a content of C contained in the base is represented by $C_m$, the following condition is met: $0.01 \leq C_m \leq 0.18$.

* * * * *